United States Patent [19]
Nagase et al.

[11] Patent Number: 5,475,611
[45] Date of Patent: Dec. 12, 1995

[54] CIRCUIT STRUCTURE, SEMICONDUCTOR INTEGRATED CIRCUIT AND PATH ROUTING METHOD AND APPARATUS THEREFOR

[75] Inventors: Hachidai Nagase, Hadano; Tatsuki Ishii, Tokyo; Katsuyoshi Suzuki, Hadano, all of Japan

[73] Assignee: Hitachi, Ltd., Tokyo, Japan

[21] Appl. No.: 266,310

[22] Filed: Jun. 27, 1994

Related U.S. Application Data

[63] Continuation of Ser. No. 446,331, Dec. 5, 1989, abandoned.

[30] Foreign Application Priority Data

Dec. 5, 1988 [JP] Japan .................... 63-307508

[51] Int. Cl.$^6$ .................................. G06F 17/50
[52] U.S. Cl. .................... 364/490; 364/489; 364/488
[58] Field of Search ...................... 364/488, 489, 364/490, 491

[56] References Cited

U.S. PATENT DOCUMENTS

| | | | |
|---|---|---|---|
| 4,613,941 | 9/1986 | Smith et al. ........................... | 364/490 |
| 4,752,887 | 6/1988 | Kuwahara ............................... | 364/491 |
| 4,835,705 | 5/1989 | Fujino et al. ............................ | 364/491 |
| 4,852,015 | 7/1989 | Doyle, Jr. ................................ | 364/491 |
| 4,855,929 | 8/1989 | Nakajima ............................... | 364/490 |

OTHER PUBLICATIONS

"Rectilinear Area Routing: A Channel Router Approach" by J. A. Hudson et al., IEEE 1985, pp. 468–471.

"A Hierarchical Routing System for VLSI Including Large Macro" by Hiwatashi et al., IEEE 1986 Cust. Integrated Circuit Conf., pp. 235–238.

*Primary Examiner*—Vincent N. Trans
*Attorney, Agent, or Firm*—Antonelli, Terry, Stout & Kraus

[57] ABSTRACT

An interconnection path layout in a circuit structure having terminals arranged in rows, such as a semiconductor integrated circuit. Paths are first assigned to selected obstruction-free terminal pairs to be interconnected, and then bypasses are assigned to the remaining obstruction-existing terminal pairs to be interconnected. This minimizes the occurrence that the terminal pairs are left un-interconnected. Also, longer vertical paths are assigned to selected terminal pairs with priority. This prevents the reserved paths from becoming obstructions to vertical paths which are later assigned to selected terminal pairs.

4 Claims, 9 Drawing Sheets

CIRCUIT STRUCTURE, SEMICONDUCTOR INTEGRATED CIRCUIT AND PATH ROUTING METHOD AND APPARATUS THEREFOR

This application is a continuation of application Ser. No. 07/446,331 filed Dec. 5, 1989 now abandoned.

BACKGROUND OF THE INVENTION

1. Field of the Invention

The present invention relates to a circuit structure and a semiconductor integrated circuit having a track layout in which a plurality of terminal rows are provided and tracks are routed to interconnect terminal (signal) pairs to be connected each other and a method and a system for laying out the routing tracks.

2. Background Art

As is well known, a semiconductor integrated circuit has a variety of circuits built therein to attain desired functions, respectively, and these circuits are constituted by interconnecting a lot of circuit elements by conductor tracks. For example, when a gate array approach is adopted for production of large scale integrated circuits (hereinafter referred to as LSI), a common mask is used throughout the processing steps including a diffusion process, except the last processing step where different masks are used in separate production runs for providing specific routing tracks or wiring interconnections in the respective chips. This approach enables a variety of chips to be produced within a remarkably shortened time.

FIG. 8 shows diagramatically a master slice LSI.

As shown in FIG. 8, various circuit elements are provided on a chip 80. More specifically, bonding pads 83 are arranged along the periphery of the square chip for permitting connection to the outside. Upper and lower annex circuit areas 82 and a plurality of cell rows 1 and wiring areas 81 are provided within a space defined by encircling train of bonding pads 83. The cell rows 1 and wiring areas 81 are arranged alternately. Each cell row 1 has transistors, resistors and other circuit elements built in the form of unit cells 84.

It is necessary to determine or route beforehand paths or tracks for interconnecting the unit cells according to a given rule. Usually such determination or routing is made in the course of designing and manufacturing of the semiconductor integrated circuits.

The determination of vertical tracks in the interconnections of LSI is discussed in IEEE Trans. on CAD, vol. CAD-2, No. 4 (1983) pp 301–312. According to this article, it is attempted to shorten or minimize the lengths of the tracks by considering positional relationship between terminals or global or tentative routing.

When it is desired to determine a track pattern in LSI having a plurality of cell rows to interconnect the cell rows therein, through holes, terminals, or the like often become obstructions for tracks. In those cases, the tracks must be routed to bypass the obstructions. To attain this, the tracks can not be formed only by vertical track segments, but they must be formed by vertical track segments crossing (usually perpendicular to) each cell row and horizontal track segments parallel to each cell row in combination.

An interspace between any two adjacent cell rows decreases with the increase of a density with which the cell rows are provided. This limits the number of horizontal wiring channels or paths to be provided in each interspace.

The prior art as referred to above, However, gives no solution of the problem which would be caused by frequent use of interspaces to bypass the obstructions present in the global vertical paths. Since there is a limitation on the number of the horizontal tracks which can be provided in one interspace as described above, there may result incomplete LSIs in which some circuit elements left un-interconnected, especially in a master slice LSI, which has only limited wiring areas.

For example, if track routing is designed only with a view to shortening the lengths of the vertical paths, the horizontal paths will increase accordingly, and occasionally some terminals can not be interconnected, and remain un-interconnected.

FIG. 7 shows this situation. First, terminals 7 and 7 are interconnected by possible shortest path, which are composed of one vertical path segment 4 and two horizontal path segments 5, and then, terminals 8 and 8 are interconnected by one vertical path segment 4 and two horizontal path segments 5. Terminals 9 and 9 can not be interconnected after all because the vertical path segment 4 reserved, running between terminals 8 and 8 constitutes an obstruction and because no further space is left for horizontal path in the interspace between the first and second cell rows 1 and 1. As a consequence, terminals 9 and 9 remain un-interconnected as indicated by 2.

The path or track routing is carried out automatically with the aid of a computer. When such un-interconnected terminals result, they must be connected manually. Sometimes the redesigning of the track routing is necessitated. As a matter of course, these require extra cost and time.

This problem can be solved by enlarging the size of the semiconductor chip or by decreasing the number of the cells. The former recourse, however, will disadvantageously cause an increase of cost, and the latter recourse is not appropriate for LSIs.

Printed circuit boards each having a lot of circuit elements connected in a limited space, have the same problem. Also, the optical path layout in optical ICs has the same problem. It is not rare that some optical elements remain optically un-interconnected.

This problem, therefore, is general for a circuit structure having a plurality of terminal rows provided thereon, with each row having terminal pairs to be interconnected to each other. This problem requires an urgent solution.

SUMMARY OF THE INVENTION

The present invention has been made to obviate the problems involved in the prior arts and it is an object of the present invention to provide a circuit structure having an interconnection path layout which is capable of suppressing occurrences of un-interconnected terminal pairs.

Another object of the present invention is to provide a semiconductor integrated circuit having an interconnection path layout which is capable of suppressing occurrences of unconnected terminal pairs.

Still another object of the present invention is to provide a method for routing an interconnection path layout which is capable of suppressing occurrences of terminal pairs remaining un-interconnected.

According to one aspect of the present invention, there is provided a circuit structure having a plurality of terminal rows provided thereon, each row having terminals to be connected to counter terminals in different rows. The circuit structure has a layout in which shortest interconnecting paths are assigned to selected terminal pairs of the first type between which no obstructions appear (the terminal pairs of the first type being selected among the terminals classified in obstruction-free group); and interconnecting bypasses are assigned to selected terminal pairs of the second type between which there appear obstructions including some shortest interconnecting paths extending between selected terminals of the first type (the terminal pairs of the second type being selected among the terminals classified in obstruction-existing group).

According to another aspect of the present invention, there is provided a circuit structure having a plurality of terminal rows provided thereon, each row having terminals to be interconnected to counter terminals in different rows via interconnecting paths each determined in terms of coordinates. The circuit structure has a layout in which shortest interconnecting paths are assigned to selected terminal pairs of the first type between which no obstructions appear (said terminal pairs of the first type being selected among the terminals classified in obstruction-free group); and interconnecting bypasses are assigned to selected terminal pairs of the second type between which there appear obstructions including some shortest interconnecting paths extending between selected terminals of the first type (said terminal pairs of the second type being selected among the terminals classified in obstruction-existing group).

According to a further aspect of the present invention, there is provided a semiconductor integrated circuit having a plurality of cell rows provided thereon, said rows being electrically interconnected to each other. The semiconductor integrated circuit has a wiring layout in which direct paths rather than bypasses are assigned to interconnect selected cell rows between which no obstructions appear whereas bypasses are assigned to interconnect selected cell rows between which there appear obstructions including some direct interconnecting paths.

According to a still further aspect of the present invention, there is provided a routing method of determining paths interconnecting between selected terminal pairs of different rows. The method includes the steps of making for each terminal pair, a decision as to whether or not an obstruction appears in the shortest path between the terminal pair; assigning a shortest path to each terminal pair between which no obstruction appears; and assigning a bypass to each terminal pair between which an obstruction appears after having assigned shortest paths to all obstruction-free terminal pairs.

The present invention further features a routing method of determining paths interconnecting between selected cell rows in a semiconductor integrated circuit. The method includes the steps of assigning direct paths rather than bypasses to interconnect selected cell rows between which no obstructions appears; and assigning bypasses to interconnect selected cell rows between which there appear obstructions including some direct paths already assigned to the selected cell rows.

The present invention further features a routing apparatus for carrying out a layout of interconnecting paths between terminal pairs selected among terminals in different rows. The apparatus includes means for making for each terminal pair, a decision as to whether or not an obstruction appears in the shortest path between a selected terminal pair; means for assigning a shortest path to each terminal pair between which no obstruction appears; and means for assigning a bypass to each terminal pair between which an obstruction appears after having assigned shortest paths to all obstruction-free terminal pairs.

According to a still further aspect of the present invention, there is provided a routing apparatus for determining interconnecting paths between terminal pairs which are selected among terminals arranged in different rows in a circuit structure. The apparatus includes means for storing a first file of interconnecting information representing the coordinates of terminals to be interconnected to each other, and a second file of obstruction information representing the coordinates of obtructionss existing between selected terminals to be interconnected; means for making a decision as to whether or not an obstruction appears between terminals selected for interconnection with reference to the first and second files: means for assigning a shortest path to each terminal pair between which no obstruction appears; and means for assigning a bypass to each terminal pair between which an obstruction appears after having assigned shortest paths to all obstruction-free terminal pairs.

According to a still another aspect of the present invention, there is provided a layout method of determining interconnecting paths between terminal pairs which are selected among terminals arranged in different rows. The method includes the steps of a) setting a global path between each terminal pair to be interconnected; b) setting a given threshold value for global path length vertically extending from one terminal to the counter terminal; c) selecting global paths whose length is longer than the threshold value to allot straight final paths to the terminal pairs whose global paths are thus selected, and setting a global path for each of the terminal pairs to which no final paths have been assigned; d) setting a smaller threshold value and repeating the steps (a) to (c) for the remaining terminal pairs; and (e) repeating the steps (a) to (d) until the threshold value has been reduced to zero.

In a circuit structure and semiconductor integrated circuit, preferably, a shorter interconnecting path is assigned to a selected terminal pair between which terminals a signal is required to be transmitted within a decreased time. Also in a circuit structure and semiconductor integrated circuit the bypasses may extend slant in a slant-wiring layer.

Signals to be transmitted from terminal to terminal are given names, and assignments of interconnecting paths may be carried out in terms of signal names. For example, required assignments may be carried out in terms of unit signals transmitted from terminal to terminal or from cell to cell.

The techniques defined in all or selected aspects may be applied in combination, to circuit structures or semiconductor integrated circuits. Also, the technique defined in one aspect may be applied to circuit structures or semiconductor integrated circuits.

As is well known in the art, if obstructions such as terminals or crossing-inhibited areas appear in the way in assigning possible shortest interconnecting paths to selected terminal pairs, it is necessary that horizontal paths be used to put vertical paths apart from such obstructions, thereby bypassing the obstructions. The number of such horizontal paths, however, is limited when the interspace between adjacent terminal rows is narrow. Also, it is necessary that throughholes be made to permit interconnection of horizontal to vertical paths. These throughholes constitute obstructions.

The present invention was made in an attempt to obviate this difficulty. In a circuit structure according to the present invention, possible shortest paths are first assigned to each of the terminal pairs selected among terminal rows between which terminal pair no obstructions appear. Because of no necessity of bypassing, there is no fear of interference between the shortest interconnecting paths thus assigned, and least number of horizontal paths are used.

Prior assignment of shortest interconnecting paths to selected terminal pairs avoids the situation in which assignment of shortest interconnecting paths is inhibited by appearance of bypasses prior assigned and partly entering such shortest paths.

According to the present invention, interconnecting bypasses are assigned later to selected terminal pairs between which there appear obstructions including some shortest interconnecting paths already determined. Formation of bypasses requires, in nature, use of horizontal paths, and therefore, the pre-assignment of shortest paths and post-assignment of bypasses will not cause undue increase of horizontal paths. As described earlier, terminal pairs selected among the terminals classified in obstruction-free group require only a few horizontal paths, and therefore it will be rare that the pre-assignment of shortest paths decreases the number of horizontal paths which are available to assignment of bypasses, to the extent that some bypasses can not be formed. Thus, the pre-assignment of shortest paths and post-assignment of bypasses according to the present invention has the effect of minimizing the occurrence in which some terminal pairs remain un-interconnected.

BRIEF DESCRIPTION OF THE DRAWINGS

Other objects and advantages of the present invention will be understood from the description of preferred embodiments of the present invention, which are shown in accompanying drawings.

DETAILED DESCRIPTION OF EMBODIMENTS

Figure 1A:
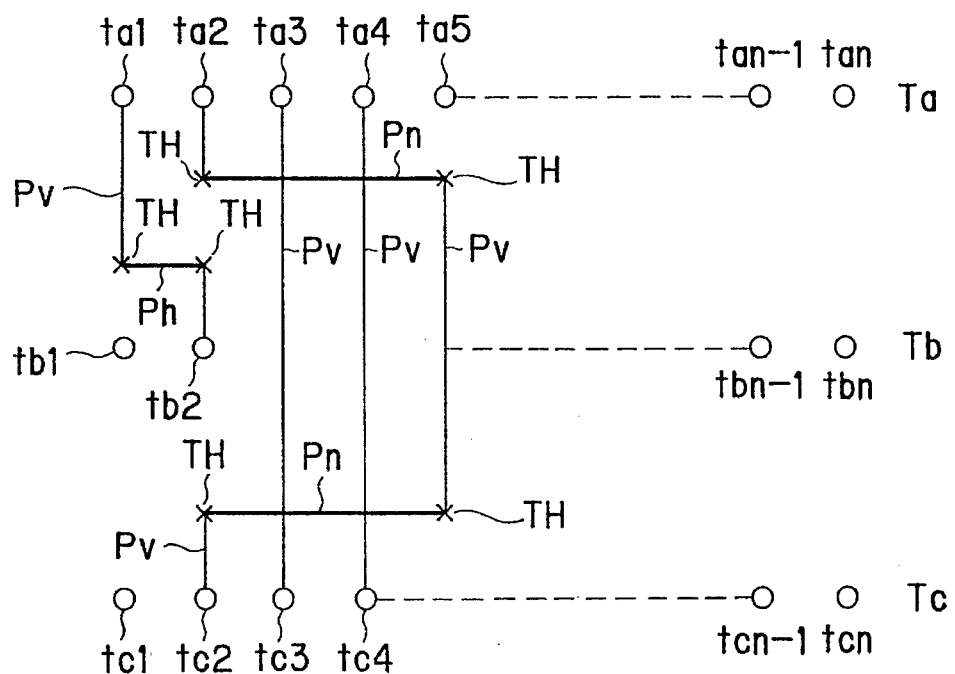
FIG. 1A shows interconnection paths of a circuit structure according to one embodiment of the present invention.

FIG. 1A shows a circuit structure according to one embodiment of the present invention.

As seen in FIG. 1A, terminal rows Ta, Tb and Tc are arranged at regular intervals. Each terminal row has a plurality of terminals ta1, ta2, ... tan; tb1, tb 2, and tc2; ta3 and tc3; ta4 and tc4; ... constitute terminal pairs to be interconnected. Desired interconnections are made by using vertical paths Pv which extend in a direction perpendicular to the rows of Ta, Tb and Tc and horizontal paths Ph which extend in parallel to the rows of Ta, Tb and Tc.

These vertical and horizontal paths extend in different layers (FIG. 3B), thereby preventing direct contact at crossing. In this and other embodiments one layer is allotted to each group of vertical and horizontal paths. As a matter of course, two or more layers may be provided for vertical or horizontal path groups. Interconnections between vertical and horizontal paths Pv and Ph are made by using connection members TH.

Positions of these terminals, vertical paths, horizontal paths and connection members are given or defined in terms of coordinates, and therefore, the interconnection path layout can be designed in terms of coordinates.

As shown in FIG. 1A, selected terminals in different rows constitute terminal pairs to be interconnected. Among these terminal pairs ta1–tb2; ta3–tc3; and ta4–tc4 are classified in obstruction-free group because no obstructions appear between each of these pairs. Terminal pair ta2–tc2 belongs to obstruction-existing group; terminal tb2 on terminal row Tb appears on a track between pair ta2–tc2 which constitutes an obstruction.

Possible shortest paths are assigned to the terminal pairs ta1–tb2; ta3–tc3; and ta4–tc4 of the obstruction-free group, and a bypass is assigned to terminal pair ta2–tc2, bypassing the obstructions, which are terminal tb2 and the straight paths running from terminal ta3 to tc3 and from ta4 to tc4.

In this and other embodiments, terminal pairs may have interconnection paths which include crossings and branches. In these cases, the terminals and/or the interconnection paths are used in common. Also, it should be noted that for the sake of simplification of description, only interconnections between terminals in different rows are exemplarily illustrated. This should not be understood as being limitative; interconnections between terminals in the same rows are not excluded.

Figure 2:
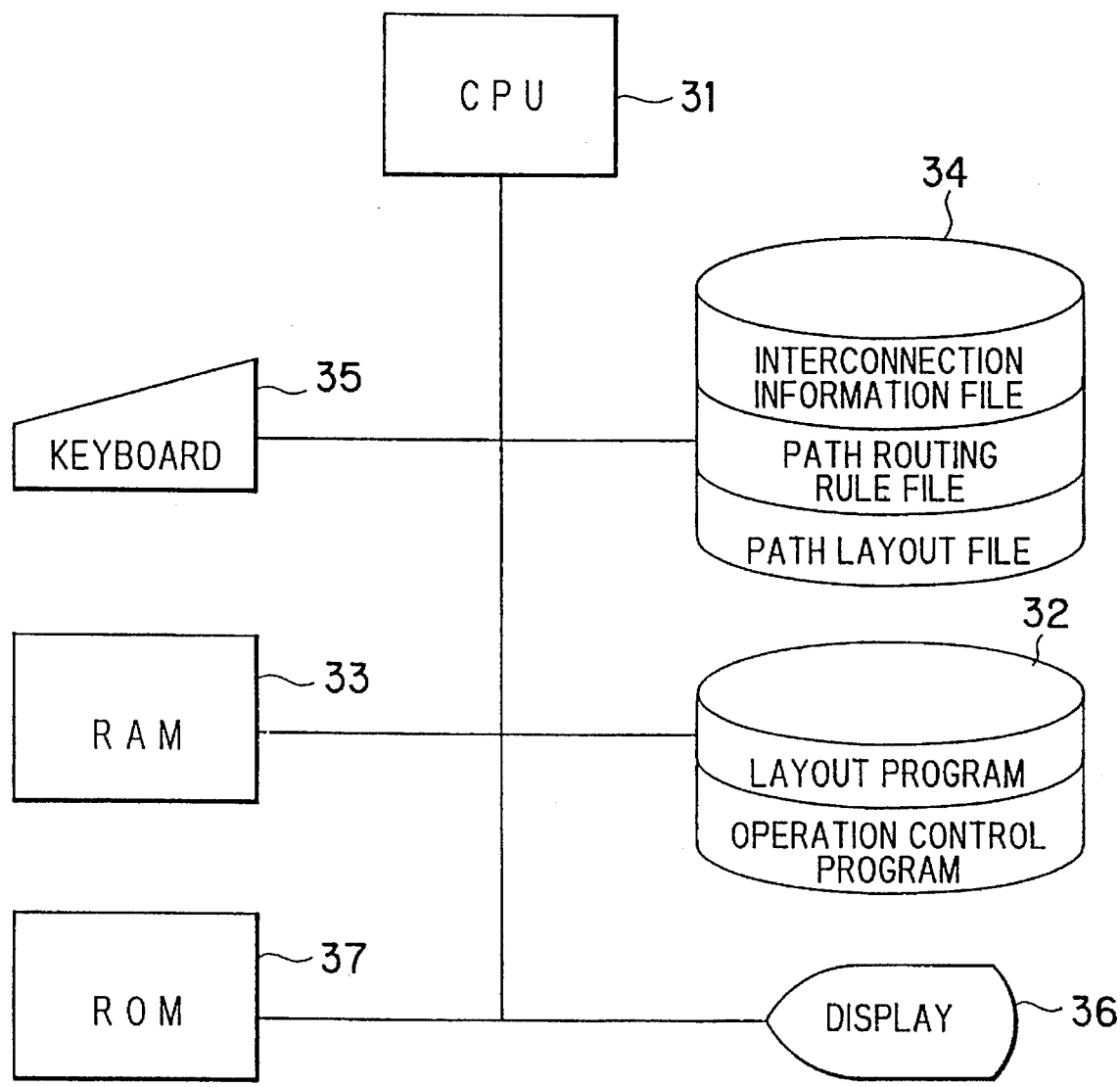
FIG. 2 is a block diagram of a hardwear structure for carrying out routing of the interconnection paths according to the embodiments of the present invention.

The interconnection path routing or layout can be attained automatically by a routing apparatus according to the present invention. FIG. 2 shows one example of such an automatic path routing or layout apparatus.

As shown in FIG. 2, the routing or layout apparatus includes a CPU 31 for controlling the whole system and for forming a required path layout with reference to various data files according to a selected program; program storing means 32 for storing operation control programs for controlling the operation of CPU 31 and layout programs for setting the sequential procedures of the interconnection path layout; and a RAM 33 for storing the selected programs when loaded, and having extra capacity available as work areas.

Also, the path routing or layout apparatus comprises a file storage 33 for storing reference files and assigned path files which are referred to in the course of forming a required layout with the aid of CPU 31. One example of reference information is a path-determining rule file containing the coordinates of terminal pairs to be interconnected and the coordinates of obstructions lying between selected terminal pairs to be interconnected. The coordinates of terminal pairs to be interconnected and the coordinates of obstructions lying between selected terminal pairs may be stored in separate files.

The path routing or layout system has a keyboard 35 for use in inputting data or instructions from the outside, a display 36 for displaying the instantaneous condition of the system, the result of processing, etc. and a ROM 37 for storing management data, special programs such as graphic programs etc.

The system described above should not be understood as limitative because different hardwears and/or softwears can be used to attain the same function.

Judgement making means, path determining means for obstruction-free terminal pairs and path determining means for obstruction-existing terminal pairs are contained in the system described above. If RAM 33 stores information available to the CPU, in the form of file, it will also constitute the file storage.

Figure 1B:
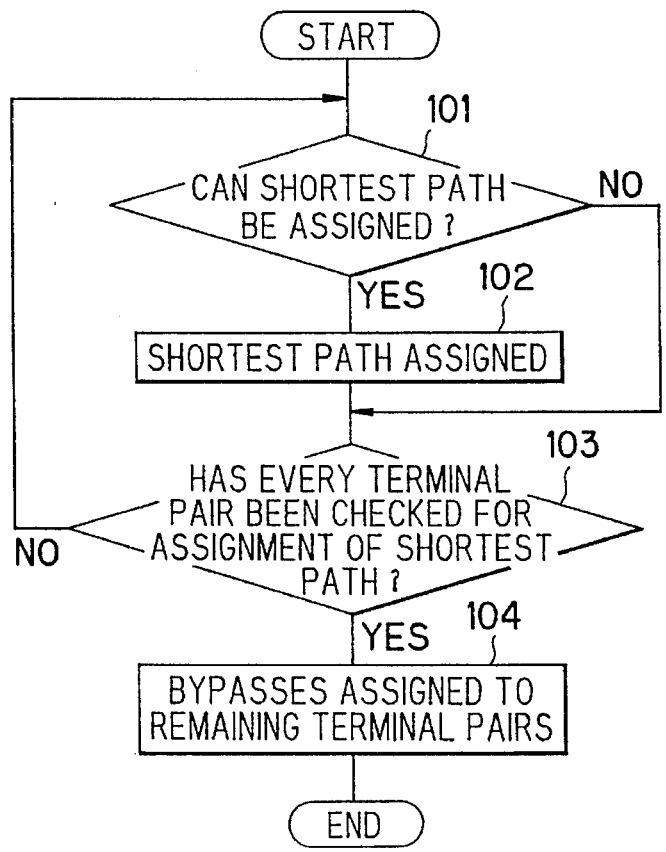
FIG. 1B shows a flowchart for routing the interconnection paths according to the present invention.

A method of determining a layout of circuit arrangement according to the present invention will now be described with reference to a flowchart of FIG. 1B.

A decision is made as to whether or not a path of minimum length can be assigned to each of the terminal pairs to be interconnected (Step 101). In making a determination, a path determination rule file, particularly an obstruction information file is referred to.

Preferably, terminal pairs to be interconnected are selected prior to path determination by referring to an interconnection information file. Selection of terminal pairs to be interconnected can be performed for each path determination, or all terminal pairs to be interconnected can be selected beforehand, and can be stored in RAM 33.

Also, tentative or global shortest paths may be assigned to the so selected terminal pairs, and then a decision as to whether an obstruction appears in the way, may be made later.

If the result of such decision shows that the shortest path is allowable, the shortest path will be actually assigned (Step 102). The shortest or minimum length path is defined as a vertical path extending from one terminal in a selected terminal row to the counter terminal in another selected terminal row if these selected terminals are positioned on the same ordinate or vertical axis, and extending across intermediate terminal rows if any, between these selected terminal rows. Or, it is defined as a combination of vertical path or paths plus horizontal path or paths extending from one terminal in a selected terminal row to the counter terminal in another selected terminal row if these selected terminals are positioned apart from each other on different ordinate or vertical axes. The vertical path or paths extends across intermediate terminal rows if any, between these selected terminal rows, and the horizontal path or paths extends a minimum distance perpendicularly to the vertical path or paths.

The results of assignment are tentatively stored in RAM 33, and finally they are stored in the path layout file.

In case where the result of decision shows that assignment of the shortest path is not permitted, the relevant terminal pair is stored in an extra area of RAM 33.

Next, a check is made on the terminal pair or pairs to which the shortest paths are assigned, and on those to which the shortest paths are not assigned. Thus, it is inspected if there is or are any remaining terminal pair or pairs of which no decision of Step 101 has been made (Step 103). So far as there remain terminal pairs of which decision of 101 has not been made, Steps 101 to 103 will be repeated.

After confirming that all terminal pairs have been subjected to decision of Step 101, bypasses will be assigned to the terminal pair or pairs to which no shortest paths can be assigned (Step 104).

The layout or routing procedures described so far will now be explained referring to the terminal rows in FIG. 1A.

As for a selected terminal pair of ta1 and tb2, these terminals are not on the same vertical axis Pv, and therefore a horizontal path Ph and connection members TH are required to establish an interconnection path between these terminals ta1 and tb2.

Figure 7:
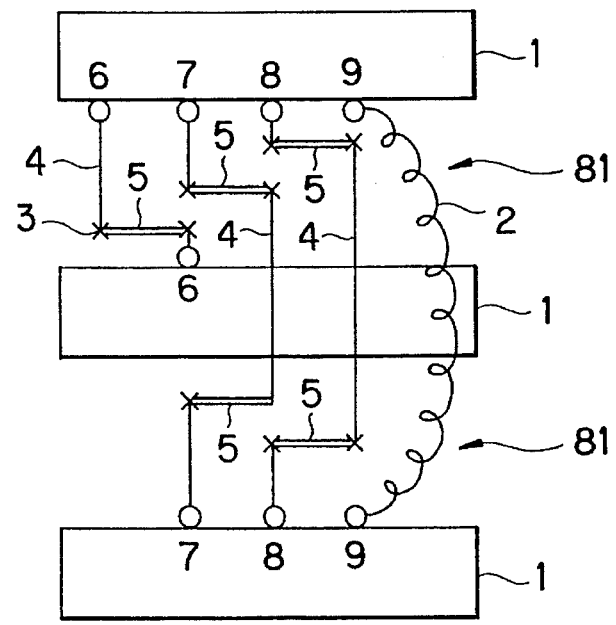
FIG. 7 is a diagram showing an interconnection path layout of a semiconductor integrated circuit which is designed according to the conventional procedures.

As for a selected terminal pair of ta2 and tc2, these terminals are on the same vertical axis Pv, but terminal tb2 appears in the way, constituting an obstruction which the interconnection path must bypass. If the adjacent vertical path Pv were selected, other terminal pairs could not be interconnected, as will be described later with reference to FIG. 7. Therefore, the shortest path can not be assigned to this terminal pair ta2 and tc2, and the assignment of path is intermitted.

As for selected terminal pairs of ta3 and tc3, and ta4 and tc4, these terminals are on the same vertical axes Pv, and there are no obstructions in the way. Therefore, the shortest paths Pv are assigned to these terminal pairs.

After completing the assignment of shortest paths to permissible terminal pairs, a bypass will be assigned to the remaining terminal pair of ta2 and tc2, between which an obstruction appears.

As for the remaining terminal pair of ta2 and tc2, the shortest paths which are reserved for or assigned to terminal pairs ta3 and tc3 and ta4 and tc4, newly constitute obstructions. Therefore, the interconnection path for the remaining terminal pair of ta2 and tc2 must bypass as well as terminal tb2 and associated connection member TH.

In assigning a bypass to the terminal pair of ta2 and tc2, it is also necessary to refer to the reserved path layout because the paths already assigned as well as the original obstruction tb 2 must be taken into consideration.

As may be understood from the above, first the shortest paths will be assigned to selected obstruction-free terminal pairs, and then bypasses will be assigned to the remaining obstruction-existing terminal pairs, and therefore no terminal pairs can remain un-interconnected.

The shortest paths are assigned to all obstruction-free terminal pairs with priority. Likewise, shortest bypasses will be assigned to terminal pairs between which signals are required to be transported within a minimized time, with priority. If such a shortest bypass constitutes an obstruction for an interconnection between another terminal pair, the terminal pair having such a bypass in the way will be treated as an obstruction-existing terminal pair. FIG. 4B exemplarily shows this situation.

The circuit arrangement as described above may be applied to an electric circuit structure and equally to an optical integrated circuit. Typical examples of electric circuit structures are semiconductor integrated circuits such as a master slice LSI and printed circuits.

The circuit arrangement may be used in a structure having paths to permit transmission of signal or energy with the aid of physical and/or chemical means, no matter what material or element may be used to constitute such a structure, for example, a fluid circuit or nerve plexus. Thus, terminals ta1 . . . , tb1 . . . , tc1 . . . constitute ports which permit inputting or outputting of signal or energy, and will be connected to signal or energy transmitters or receivers.

In the case where the circuit arrangement is used in a printed circuit, terminals ta1 . . . , tb1 . . . , tc1 . . . , will be used as terminals to which signal or electric power is supplied or from which it is retrieved. Then, transmitters or receivers will be connected to selected terminals. The connection members may be through holes.

If the circuit arrangement is used in an optical integrated circuit, terminals ta1 . . . , tb1 . . . , tc1 . . . will be used as terminals at which light enters or gets out. The paths will be used as optical paths, and the connection members may be deflectors such as mirrors or prisms.

An application to a semiconductor integrated circuit will now be described with reference to FIGS. 8 and 3A.

Figure 3A:
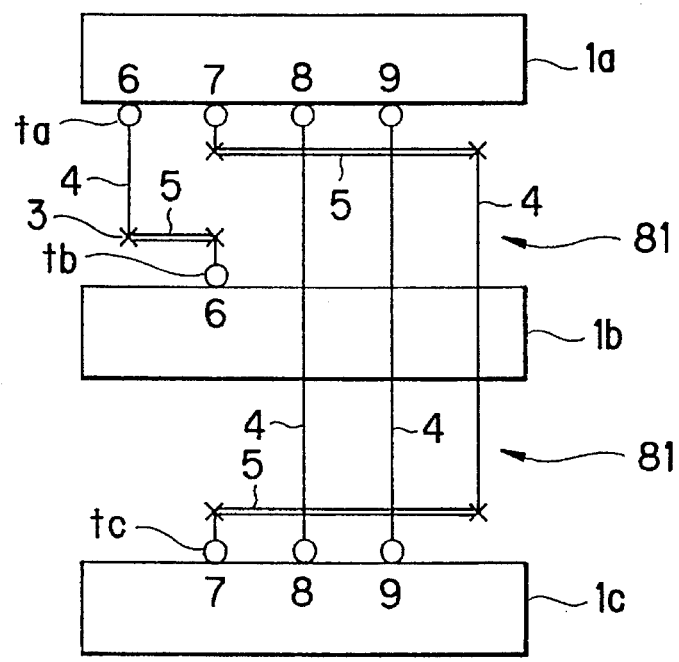
FIG. 3A shows interconnection paths of a semiconductor integrated circuit according to the present invention.
Figure 3B:
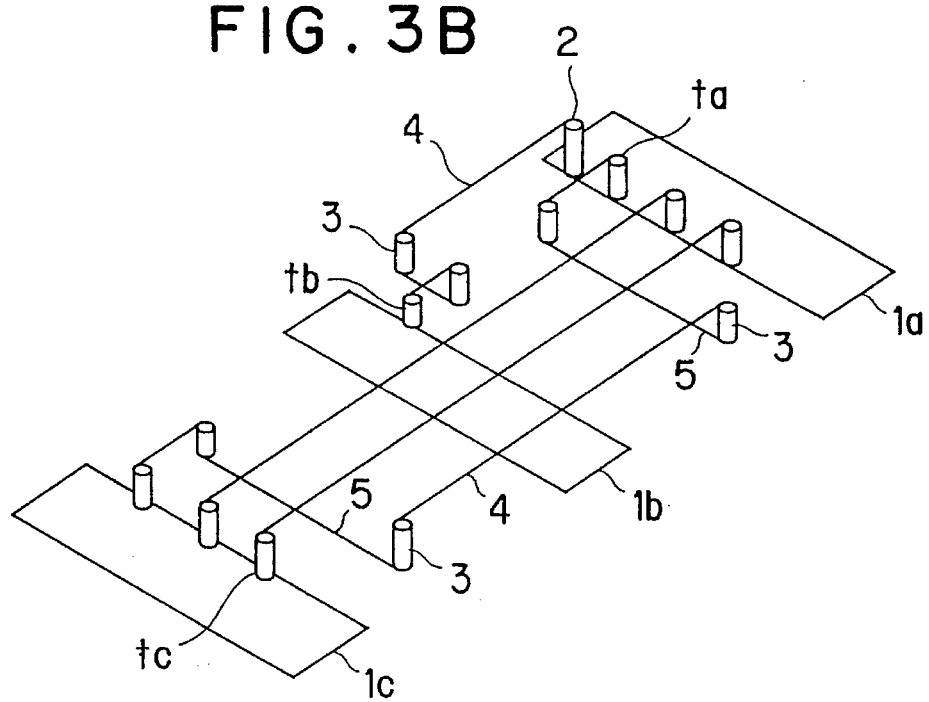
FIG. 3B shows diagramatically layer structure in which vertical paths and horizontal paths are provided on separate layer according to the present invention.
Figure 8:
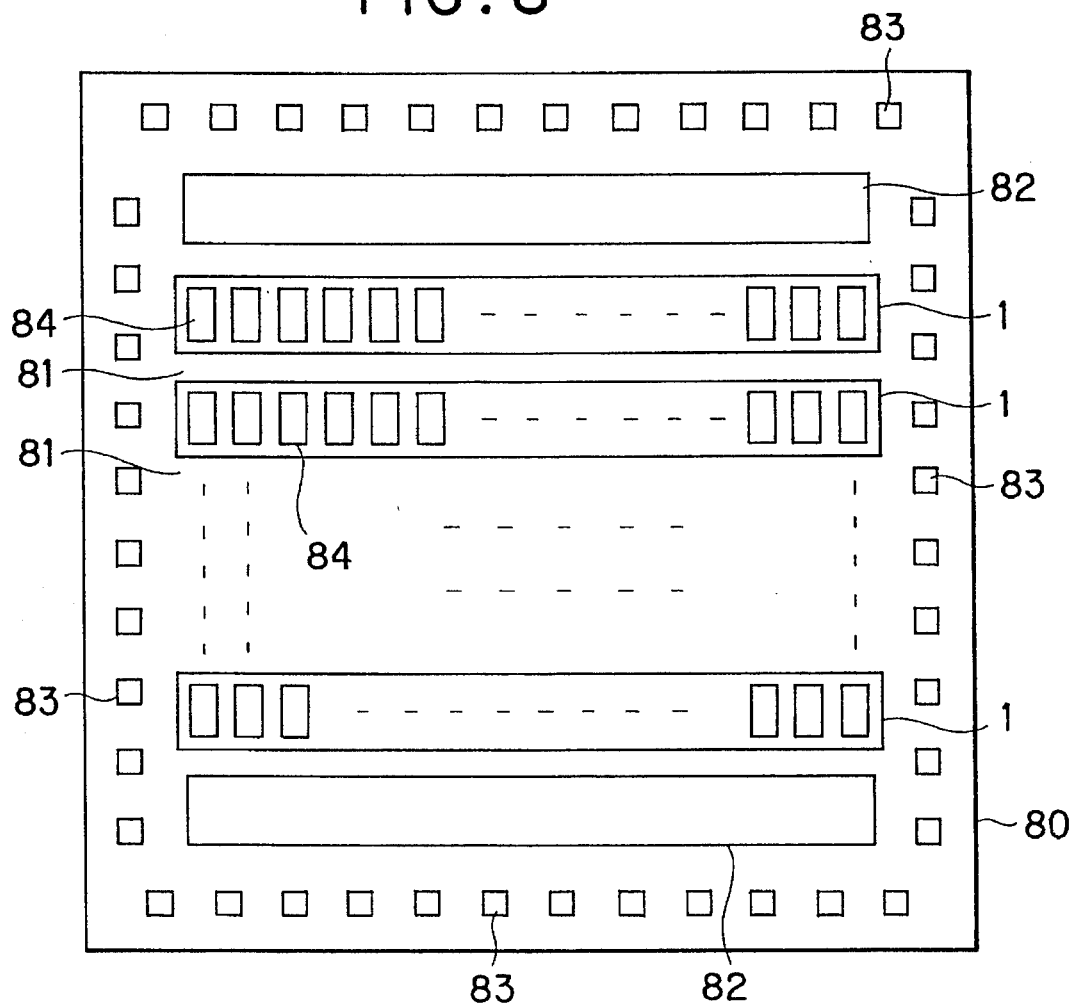
FIG. 8 shows exemplarily a general configuration of a master slice LSI.

FIG. 8 illustrates the structure of a semiconductor integrated circuit, whereas FIG. 3A shows a selected part of the integrated circuit structure at an enlarged scale.

In FIG. 3A three cell rows 1a, 1b and 1c are disposed with wiring areas 81 therebetween. Each cell row has terminals for interconnecting use. These terminals are arranged in rows along the cell rows 1a, 1b and 1c. Two terminals to be interconnected are indicated by the same reference number. Vertical and horizontal paths are indicated by 4 and 5 respectively. As seen from FIG. 3B, vertical and horizontal paths are arranged in different layers at different levels. Throughholes 3 are used to interconnect selected vertical and horizontal paths.

The wiring layout in this embodiment is carried out in a manner similar to that employed in the embodiment of FIG. 1A. FIG. 3A shows the identical terminal arrangement and obstruction positions with those of FIG. 1A, and therefore, the resultant wiring layout has the same pattern as in FIG. 1A.

Figure 3C:
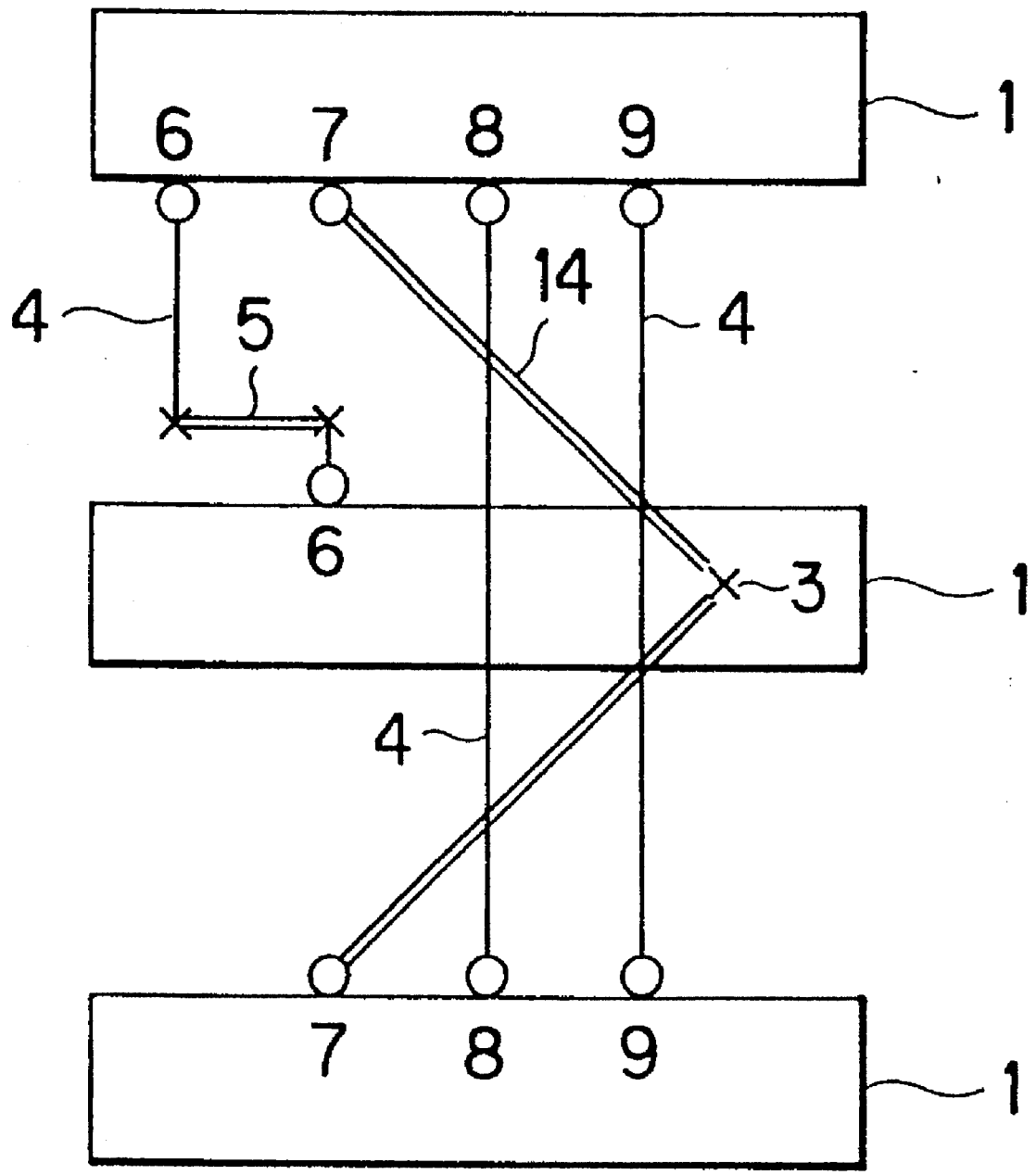
FIGS. 3C, 4A, 4B and 5A show other forms of semiconductor integrated circuit according to preferred embodiments of the present invention.

When the semiconductor integrated circuit to which the routing or layout method of the present invention is applied has a wiring layer for slant interconnections as well as the layers for vertical and horizontal interconnections, bypasses can be formed by using this layer for slant interconnections. In this case, slant interconnections 14 and associated throughholes 3 are used to form the bypass interconnections as can be seen from FIG. 3C.

Figure 4A:
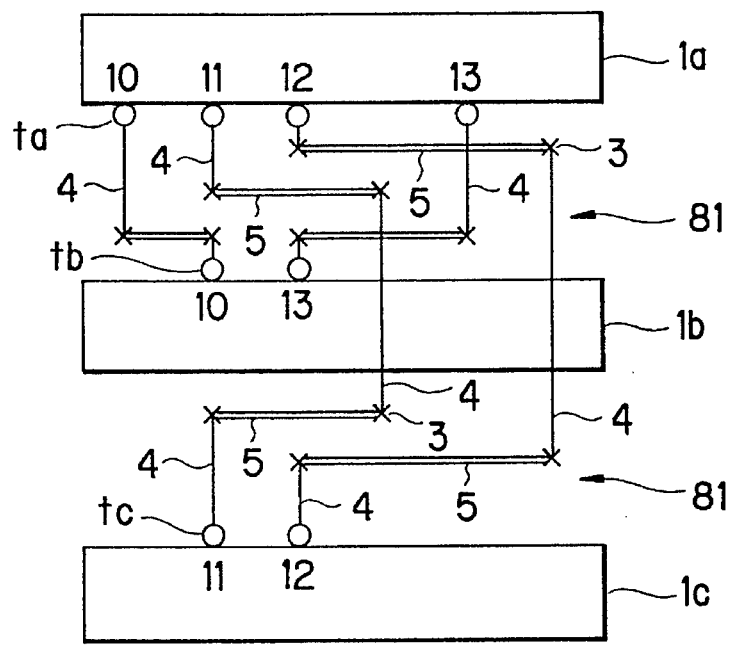
Figure 4B:
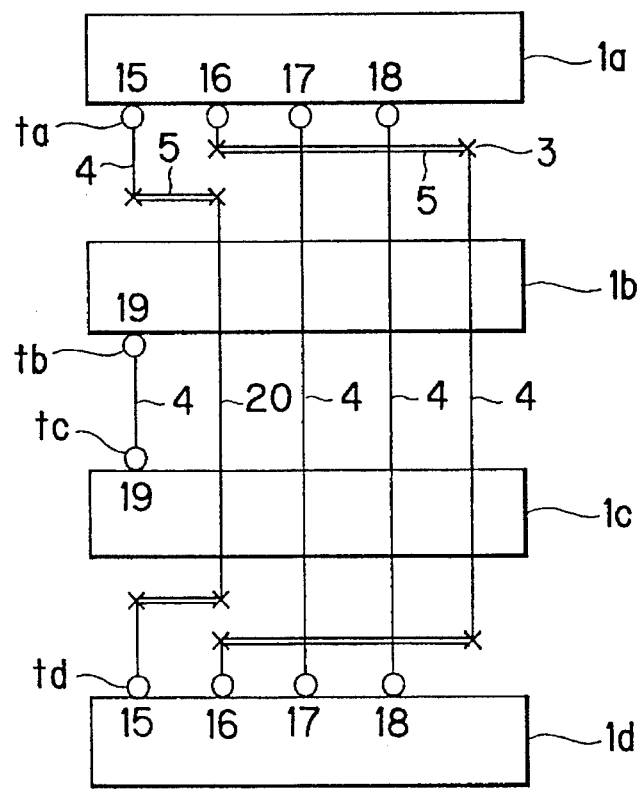

Another form of semiconductor integrated circuit whose terminal row arrangement is different from that of FIG. 3A, is given in FIGS. 4A and 4B.

In FIG. 4A, cell rows are indicated by 1a, 1b and 1c whereas terminals are indicated by ta, tb and tc. In this embodiment, the shortest paths are assigned to terminals 10—10 and 13—13. As for interconnections between terminals 11—11 and between terminals 12—12, terminals 10 and 13 in the intermediate cell row constitute obstructions, which must be bypassesd.

A decision as to which terminal pair a shortest bypass should be assigned, is made by taking into consideration as to which terminal pair requires minimized delay in signal transmission. In this particular embodiment, the shortest bypass is assigned to terminal pair 11—11 with priority.

In FIG. 4B, four cell rows are indicated at 1a, 1b, 1c and 1d whereas terminals are indicated at ta, tb, tc and td. In this embodiment, the shortest vertical interconnections are assigned to obstruction-free terminal pairs 17—17, 18—18 and 19—19. As for interconnections between terminals 15—15 and between terminals 16—16, a shortest bypass 20 is assigned to terminals 15—15 to meet the requirement for possible minimized delay in signal transmission between terminals 15—15. If there is not such a requirement, the shortest vertical path would be assigned to terminal pair 16—16. As a result of assignment of the bypass 20 to the terminal pair 15—15, the bypass 20 constitutes an obstruction between terminal pair 16—16. Consequently, another bypass must be assigned to the obstruction-existing terminal pair 16—16 to avoid any interference with the bypass and vertical paths between the other terminal pairs.

As can be understood from the above, later assignment of path to terminal pair 16—16 would prevent terminal pairs 17—17 and 18—18 from remaining un-interconnected.

Figure 5A:
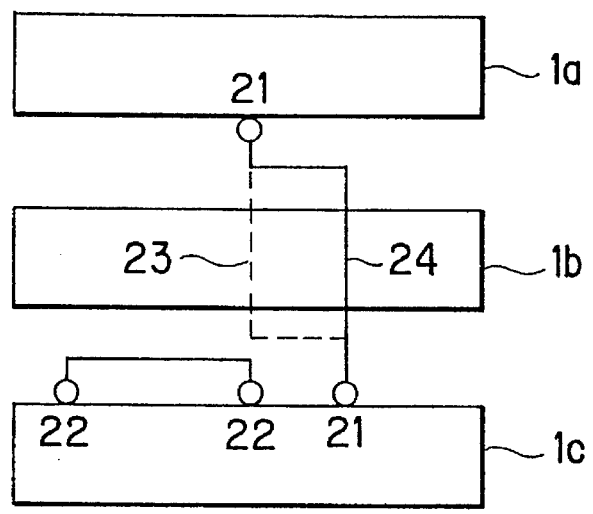

FIG. 5A shows the way how one shortest bypass is selected from two possible shortest bypasses which can be assigned to a selected terminal pair.

In FIG. 5A there are two possible shortest bypasses 23 and 24 which can be assigned to terminal pair 21—21 in cell rows 1a and 1c, respectively. The bypass 24 is selected in consideration of existence of an obstructive interconnection between terminals 22 and 22 in an extension of the bypass 23. The bypass 24 is selected to avoid leaving the terminal pair 22—22 un-interconnected.

The bypass 23 is regarded as an obstruction-existing path. However, since there is another bypass 24 to be assigned to terminal pair 21—21, no interruption is caused in assignment procedures. Thus, the bypass 24 is assigned to the terminal pair 21—21 and can be prevented from being left un-interconnected due to another possible interconnection assigned later.

Figure 5B:
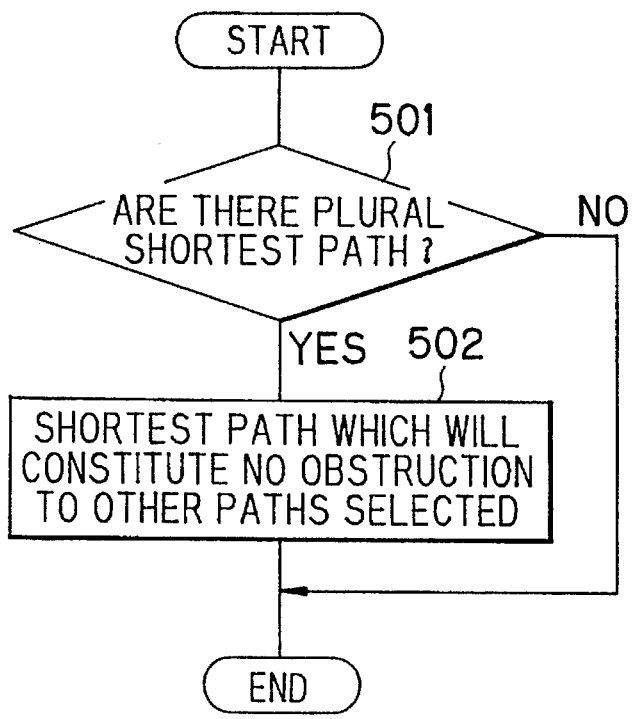
FIG. 5B is a flowchart showing procedures for routing the interconnection paths according to FIG. 5A.

FIG. 5B shows a flow chart for the assignment procedures to form the layout given in FIG. 5A.

According to the flow chart of FIG. 5B, CPU 31 makes a decision as to whether or not there are two or more shortest paths between a given terminal pair (Step 501). In the affirmative, the shortest path which constitutes no obstruction to other terminal pair interconnections is selected (Step 502). In the negative, it proceeds to a next step. This procedure may be included in Step 101 of FIG. 1B.

As may be understood from the embodiments given above, terminal pairs will rarely be left un-interconnected, and the time necessary for designing a layout of LSI can be substantially shortened. further, a chip size of a custom LSI can be reduced, and accordingly the manufacturing cost can be reduced. Still advantageously, shortest paths can be assigned to terminal pairs which require a minimized delay in transmission of signal. This enables LSI to be operated at a high speed.

FIGS. 3A to 5B show embodiments in which the circuit structures of the present invention are applied to the semiconductor integrated circuits. As a matter of course, the present invention can equally be applied to different circuit structures such as printed circuits or optical integrated circuits.

Figure 6A:
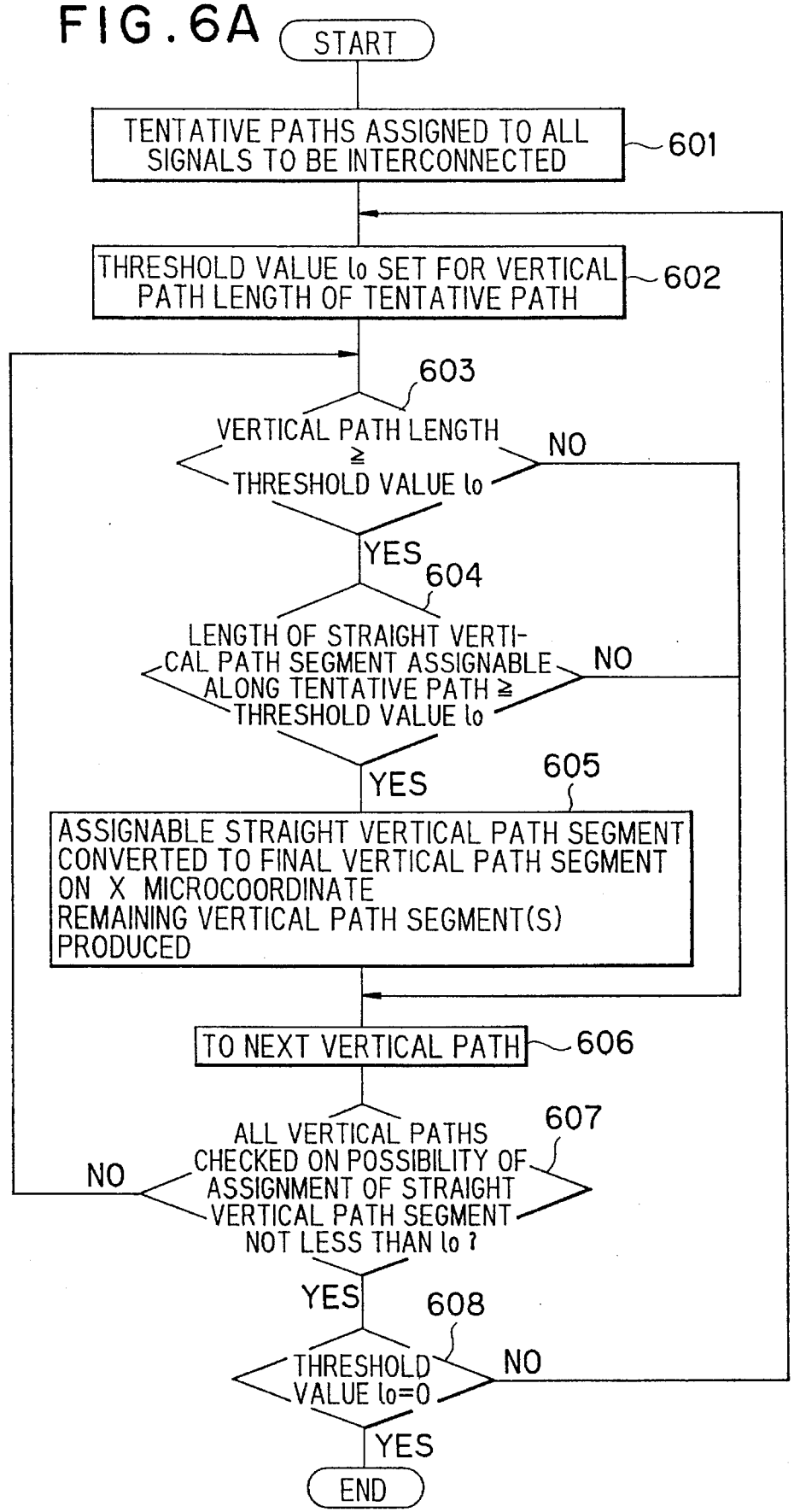
FIG. 6A is a flowchart showing another procedure for routing the interconnection paths according to the present invention.

Another routing method or layout designing method according to the present invention will now be given with reference to FIG. 6A and FIG. 6B.

According to this method, a threshold value lo is first set for assignment of vertical path. Assignment operations are then carried out for vertical paths which are longer than the threshold value lo until no vertical paths which are longer than the threshold value lo are left. Then, the threshold value is renewed for a decreased one, and assignment operations are further carried out in a similar way. This method can be applied to any kind of circuit structure.

This method may be carried out, for example, by the hardwear as shown in FIG. 2.

First, tentative or global paths are given to all signal-inputting or outputting objects to be connected, that is, terminal pairs (Step 601). Final paths will be given in terms of point-defining coordinates (micro-coordinates). The global paths, however, will be given in terms of rough or global coordinates (macro-coordinates). An "X" coordinate increment or graduation in the macro-vertical coordinates includes "X" coordinate points in the micro-vertical coordinates. Therefore, a signal vertical path in the macro-coordinates will contain a plurality of vertical paths in the micro-coordinates.

Next, a threshold value lo is determined as a straight vertical line segment which can be extended without encountering an obstruction (Step 602). This threshold value lo is given in terms of the number of coordinate increments representing the length extending from terminal row to terminal row in the macro-coordinates.

Thereafter, a decision is made as to whether or not each global path is equal to or longer than the threshold length lo (Step 603). As regards the vertical paths whose length is longer than lo, the length of a straight vertical path segment which extends along the global vertical path and can be assigned to a selected terminal pair, is determined. Then, a decision is made as to whether or not the so determined length is equal to or longer than lo (Step 604). In the affirmative, the straight vertical path is converted to the final path given in terms of "X" micro-coordinate (Step 605). New vertical paths will be routed for a remaining portion of the vertical path in case assignment of the straight interconnection path is not permitted.

If there are a plurality of possible paths to be selected for assignment, a most appropriate one may be selected by sorting such possible paths into "shortest total length", "longer assignable length" etc. and by determining as to which path meets a better condition.

If a single straight path is not sufficient to make necessary interconnection, a global path will be given to the remaining portion which is required for completing path assignment. Then, such a new global path is conditioned to be interconnected to the already assigned straight path.

Thereafter, the next path assignment follows. Prior to the processing of the next path assignment, however, a decision is made as to whether or not all vertical paths are checked on the possibility of a straight vertical length which is longer than the threshold length lo being assigned (Steps 606 and 607). The processings of Step 603, 604 and 605 will be repeated until no vertical paths have been left unchecked.

If the threshold value lo is not zero (Step 608), the procedure will return to Step 602, and then the threshold value will be reduced, and the above-mentioned procedures will be repeated. A series of Steps 603–607 will be repeated for each of sequentially decreased threshold values lo. Finally, the threshold value lo becomes zero, and then every vertical path is set on its "X" micro-coordinate point. Thus, the procedures have been completed.

The threshold value lo can be set by using the measure of the width of the cell row or coordinate graduation as a unit. If the width of the cell row is used as a unit, the coordinate graduation will be a decimal fraction of the unit.

As is apparent from the above, assignment of the shortest vertical paths are carried out in such a way that longer vertical paths may be selected prior to shorter vertical paths by sequentially decreasing the threshold value. Assignment of longer vertical paths prior to shorter ones is effective to minimize the possibility of leaving certain terminal pairs un-interconnected. Shorter vertical paths if they were assigned to selected terminal pairs with priority, would be likely to constitute obstructions to the longer interconnection which will be made later. This may be a cause for leaving such selected terminal pairs un-interconnected. Another advantage which is attributable to preferential assignment of longer paths is that, generally, the signal-transmission delay is not increased so much when the short path is bypassed. In case of preferential assignment of shorter paths, the longer paths would possibly be assigned with longer bypasses to bypass the reserved shorter paths which appear as obstructions. The so assigned bypasses further increase the lengths of the paths and increase the signal-transmission delay accordingly.

A specific example of the path assignment according to the present invention will now be described with reference to FIG. 6B.

Figure 6B:
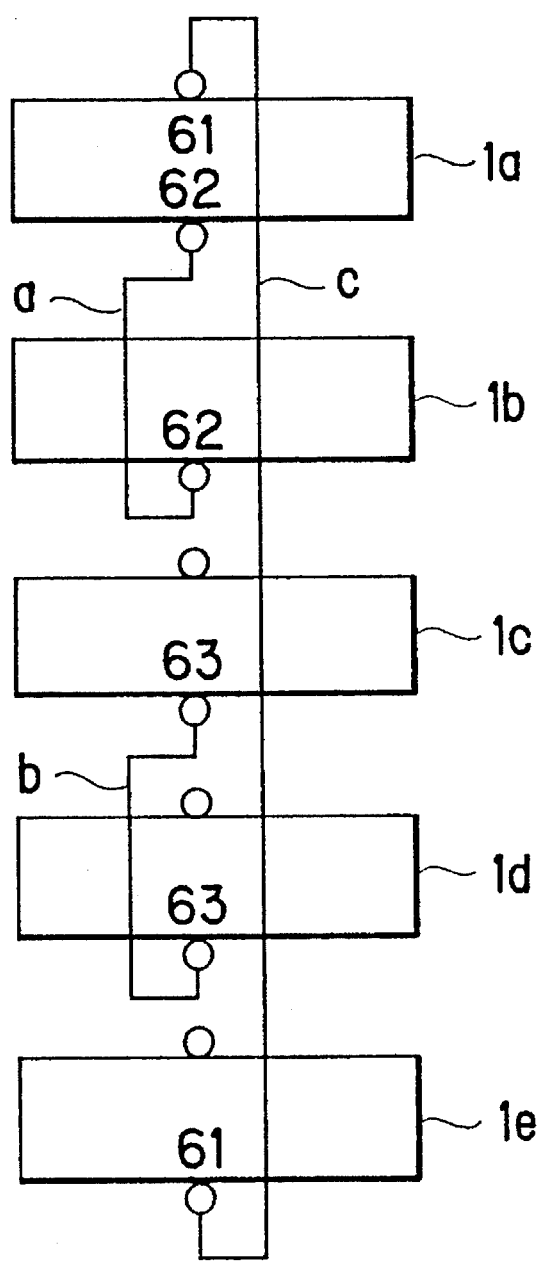
FIG. 6B is a diagram showing an interconnection path layout of a semiconductor integrated circuit which is obtained according to the procedures of the flowchart shown in FIG. 6A.

In FIG. 6B, paths a,b and c are assigned to selected terminal pairs in cell rows 1a, 1b, 1c, 1d and 1e. The cell rows are shown as having a with equal to the width of a global path. Specifically, the path "a" is a global path whose length is long enough to cross the cell row 1b, and whose horizontal position is within the horizontal length of the cell row; the path "b" is a global path whose length is long enough to cross the cell row 1d, and whose horizontal position is within the horizontal length of the cell row; and the path "c" is a global path whose length is long enough to cross the cell rows 1a, 1b, 1c, 1d and 1e, and whose horizontal position within the horizontal length of the cell row.

Each global path is compared with a threshold value, which is set for example, to be three cell rows across, that is, "3". Necessary comparisons are made in the order of a, b and c.

Assignment of the path "a" is not permissible because it is below the threshold value. Thus, assignment will be effected later.

Assignment of the path "b" is not permissible for the same reason. Thus, assignment will be postponed.

Assignment of the path "c" is permissible because it extends five cells across, and is above the threshold value. Thus, a straight path is assigned to terminals 61 in the cell rows 1a and 1e. No straight line extending from one terminal 61 in the cell row 1a to the other terminal 61 in the cell row 1e, can be assigned because of existence of the other terminals 62 and 63 in the way. Therefore a vertical path which runs adjacent to the terminals 61, 62 and 63, is selected within the global path.

The remaining portions of the path "c" extend a short distance directly from each of upper and lower terminals 61 to a short horizontal extension to reach the straight vertical length. These remaining portions, however, cannot be set because such remaining portions do not meet the above requirement. Therefore, global paths each having a length within the width of the cell row will be assigned to the remaining short vertical lengths.

Thereafter, the threshold value is set to be two, and necessary comparisons are made. The remaining global paths "a" and "b" are shorter than the threshold length, and therefore no assignment is possible. Then, the threshold value is reduced to one.

The global paths "a" and "b" can have a straight vertical length to be assigned. As for the global path "a", it has terminals 62 as obstructions, and therefore no direct straight interconnection is permissible. The vertical length "c" runs on the right side of terminals 62 to prevent the positioning of a straight length on this side. There is, however, no obstruction on the left side of terminals 62, and therefore a straight vertical length is set on this side.

Likewise, a straight vertical length is selected in the global path "b" to be set on the left side of terminals 63.

In these cases, the vertical extensions from terminals 62 and 63 remain for assignment, and global paths will be assigned as is the case with the path "c".

A necessary path assigning operation will be repeated for each of sequentially decreasing threshold values until the threshold value has been reduced to zero. Then, assignments of all vertical paths will be completed. Thereafter, necessary horizontal paths will be assigned to interconnect associated vertical lengths.

The path-layout designing just described can also be applied to electrical, optical and other circuit structures.

Figure 6C:
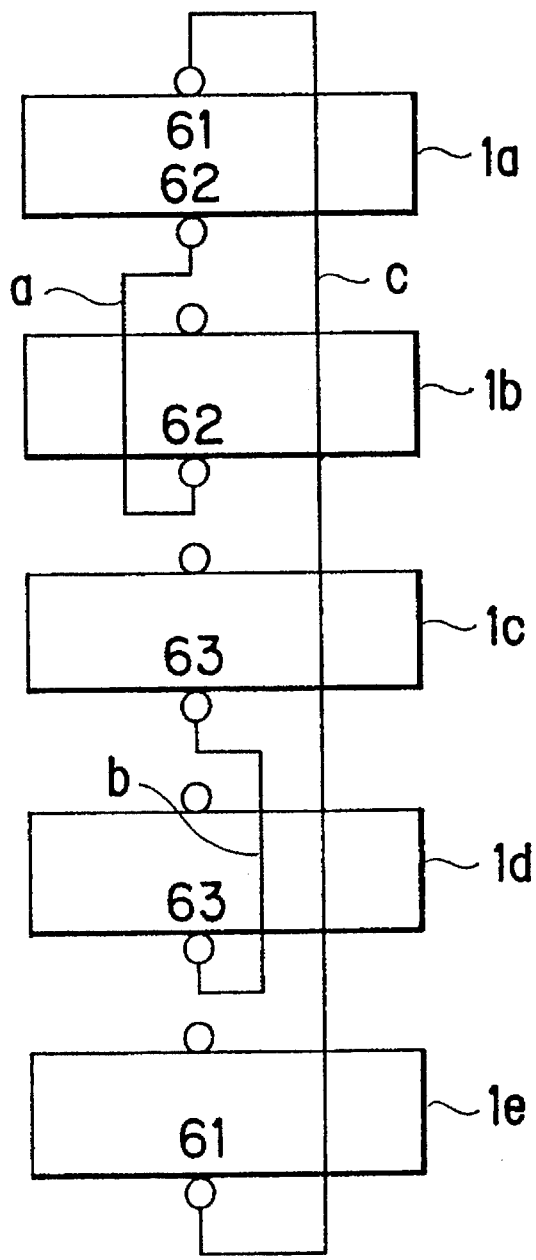
FIG. 6C is a diagram showing an interconnection path layout of a semiconductor integrated circuit which is obtained by conventional routing procedures.

FIG. 6C shows a conventional manner in which a path layout is carried out in the same cell pattern. Necessary paths are assigned in the order of "a", "b" and "c". As seen from FIG. 6C, it is possible that the vertical length "b" is assigned on the right side of terminals 63. This seems to be caused by: the existence of the vertical length "a" is known prior to assignment of the vertical length "b", but the existence of the vertical length "c" is unknown.

The vertical length "b" running on the right side of terminals 63 constitutes an obstruction which the vertical length "c" must bypass by shifting towards the right a distance which is longer than the distance by which the vertical length "c" would shift if the vertical length "b" ran on the left side as in FIG. 6B. Thus, extra length results. In some occassions, additional obstructions may appear, and accordingly still longer extra length may result. In worst occations, there may be appear so may obstructions that necessary vertical path assignment may be inhibited.

In contrast to this, the assignment of longer vertical paths with priority assures that later longer path assignment cannot be prevented by existing shorter paths. As is apparent from comparison between FIGS. 6B and 6C, the assignment of longer vertical paths with priority according to the present invention has the effect of increasing the freedom with which the shortest path can be selected.

As a matter of course, the layout forming method just described above can be applied to the whole circuit pattern designing, but it can be equally applied to a selected portion or portions of the whole circuit. Layout proceeding may be selected among the examples described herein, and can be applied to a same circuit structure in combination.

As may be understood from the above, in designing a terminal-to-terminal interconnecting pattern within the limited space of a circuit structure, the present invention assures that no terminal pairs remain un-interconnected.

What is claimed is:

1. A method of determining interconnection paths between terminal pairs which are selected among terminals arranged in different terminal rows of a specific layout of electrical conductors, comprising the steps executed by a computer of:

(a) setting a global path defined in macro-coordinates between each terminal pair to be interconnected, said global path includes a plurality of segments defined in micro-coordinates;

(b) in the set global path, selecting a segment to which a final vertical straight path is assignable and which is longer than other segments, and assigning said final vertical path to the selected segment;

(c) setting a new global path in a portion where no final vertical path has been assigned, and returning to the step (b); and (d) repeating the steps of (b) and (c) until final vertical paths are assigned to the terminal pairs.

2. A method of determining interconnection paths between terminal pairs which are selected among terminals arranged in different terminal rows of a specific layout of electrical conductors, comprising the steps executed by a computer of:

(a) setting a global path defined in macro-coordinates between each terminal pair to be interconnected, said global path includes a plurality of segments defined in micro-coordinates;

(b) in the set global path, selecting a segment to which a final vertical straight path is assignable in a direction crossing the terminal rows and which is longer in length then other segments, and assigning said final vertical path to the selected segment;

(c) setting a new global path in a portion where no final vertical path has been assigned and return to the step (b);

(d) repeating the steps (b) and (c) until final vertical paths in a direction crossing the terminal rows are assigned to each of the terminal pairs; and (e) assigning final horizontal paths to each of the final vertical paths in a direction parallel to the terminal rows for each of the final vertical paths to complete the interconnection between the selected terminal paths.

3. A method of determining interconnection paths between terminal pairs which are selected among terminals arranged in different terminal rows of a specific layout of electrical conductors, comprising the steps executed by a computer of:

(a) setting a global path defined in macro-coordinates between each terminal pair to be interconnected, said global path includes a plurality of segments defined in micro-coordinates;

(b) setting a given threshold value Lo for a length of a vertical segment included in said global path extending from one terminal to the opposite terminal of said terminal pair;

(c) selecting at least one global path each having a vertical segment having a length longer than said threshold value $L_o$;

(d) selecting a vertical segment whose length is longer than said threshold value $L_o$ from among vertical segments included in said at least one global path selected in the step (c) and to which a final vertical straight path is assignable and assigning said final vertical path to the selected vertical segment;

(e) deciding whether a portion to which no final vertical path has been assigned still exists in each of the global paths in which the final vertical paths have been assigned, and if the portion exists, setting a new global path for said portion where no final vertical path has been assigned;

(f) returning to the step (b) while making said threshold value $L_o$ smaller in order to execute the steps (b)–(e) as to the global paths in which no final vertical path has been assigned;

(g) repeating the steps (b)–(f) until said threshold value $L_o$ has been reduced to zero; and (h) assigning a final horizontal path in a direction parallel to the terminal rows for each of the final vertical paths to complete the interconnection between the selected terminal pairs.

4. A method of determining interconnection paths between terminal pairs which are selected among terminals arranged in different terminal rows of a specific layout of electrical conductors, comprising the steps executed by a computer of:

(a) setting a global path defined in macro-coordinates between each terminal pair to be interconnected, said global path includes a plurality of segments defined in micro-coordinates;

(b) setting a given threshold value for a length of a vertical segment included in said global path extending from one terminal to the opposite terminal of said terminal pair;

(c) selecting a vertical segment whose length is longer than said threshold value from among vertical segments included in said global path and to which a final vertical path is assignable and assigning said final vertical straight path to the selected vertical segment;

(d) deciding whether a portion to which no final vertical path has been assigned still exists in each of the global paths in which the final vertical paths have been assigned, and if the portion exists, setting a new global path for said portion where no final vertical path has been assigned;

(e) returning to the step (b) while making said threshold value smaller in order to execute the steps (b)–(d) as to the global paths in which no final vertical path has been assigned;

(f) repeating the steps (b)–(e) until said threshold value has been reduced to zero; and (g) assigning a final horizontal path in a direction parallel to the terminal rows for each of the final vertical paths to complete the interconnection between the selected terminal pairs.

* * * * *